United States Patent

Schnetzka et al.

[11] Patent Number: 5,898,554
[45] Date of Patent: Apr. 27, 1999

[54] SWITCH DRIVER CIRCUIT

[75] Inventors: Harold R. Schnetzka; Donald L. Tollinger; Frank E. Wills, all of York, Pa.

[73] Assignee: York International Corporation, York, Pa.

[21] Appl. No.: 08/958,711

[22] Filed: Nov. 17, 1997

Related U.S. Application Data

[63] Continuation of application No. 08/466,271, Jun. 6, 1995, abandoned.

[51] Int. Cl.$^6$ ........................................................ H02H 9/00
[52] U.S. Cl. .............................................. 361/18; 323/276
[58] Field of Search ................... 361/18, 56, 93, 361/88; 327/574; 323/265, 273, 276

[56] References Cited

U.S. PATENT DOCUMENTS

| | | | |
|---|---|---|---|
| Re. 34,107 | 10/1992 | Wirth | 361/18 |
| 4,721,869 | 1/1988 | Okado | 307/570 |
| 4,866,313 | 9/1989 | Tabata et al. | 307/570 |
| 4,949,213 | 8/1990 | Sasagawa | 361/91 |
| 4,954,917 | 9/1990 | Wirth | 361/98 |
| 5,055,721 | 10/1991 | Majumdar et al. | 307/570 |
| 5,089,719 | 2/1992 | Kamei et al. | 307/570 |
| 5,091,664 | 2/1992 | Furuhata | 307/570 |
| 5,121,283 | 6/1992 | Ibori et al. | 361/93 |
| 5,153,802 | 10/1992 | Mertz et al. | 361/18 |
| 5,173,848 | 12/1992 | Roof . | |
| 5,200,878 | 4/1993 | Sasagawa et al. | 361/93 |
| 5,200,879 | 4/1993 | Sasawaga et al. | 361/93 |
| 5,210,479 | 5/1993 | Kimura et al. | 318/727 |
| 5,218,523 | 6/1993 | Sugishima | 363/132 |
| 5,287,023 | 2/1994 | Miyasaka | 307/594 |
| 5,296,765 | 3/1994 | Williams et al. | 307/572 |
| 5,301,085 | 4/1994 | Miettinen | 361/93 |
| 5,303,110 | 4/1994 | Kumagai | 361/18 |
| 5,402,042 | 3/1995 | Madsen | 315/174 |

FOREIGN PATENT DOCUMENTS 0643485  3/1995  European Pat. Off. .

OTHER PUBLICATIONS

"Fuji Hybrid IC for IGBT Application Manual", Fuji Electric Co., Ltd.

"Toshiba IGBT App. Notes" Toshiba Corp., 1992, pp. 75–76, 20–21, 24, 26.

R. Chookhawala et al., "IGBT Fault Current Limiting Circuit," 1993 IEEE 0–7803–1462–x/93S03.00, pp. 1339–1345.

R. Chokhawala et al., "Switching Voltage Transient Protection Schemes For High Current IGBT Modules," IEEE.

IGBT Module Application and Technical Databook by Powerex, Inc.

Primary Examiner—Sally C. Medley
Attorney, Agent, or Firm—Finnegan, Henderson, Farabow, Garrett & Dunner, L.L.P.

[57] ABSTRACT

A driver circuit for a semiconductor power switch. The driver circuit supplies a high voltage pulse to the gate of an IGBT. The driver circuit also monitors the voltage on the collector of the IGBT with respect to the emitter. If the voltage at the collector of the IGBT does not drop when the IQBT is turned on, the IGBT driver circuit detects a short circuit and triggers a linear integrator within the driver circuit. The linear integrator gently ramps down the voltage on the gate of the IGBT.

15 Claims, 6 Drawing Sheets

SWITCH DRIVER CIRCUIT

This application is a continuation of application Ser. No. 08/466,271 Jun. 6, 1995, now abandoned.

BACKGROUND OF THE INVENTION

1. Field of the Invention

The present invention relates to a driving circuit for a semiconductor power switch. Although suitable for any type of semiconductor power switch, the present invention is especially useful for a gate driving circuit for an insulated gate bipolar transistor.

2. Description of the Related Art

Air conditioners such as centrifugal chillers require a motor to turn an impeller. The motor may be, for example, a 150 to 900 horsepower 3-phase induction motor. Such motors run on alternating current (AC). Generally, the motor is connected directly to a standard AC power line such as a 460 volt power line which causes it to run at a fixed speed.

Because the motor which drives the centrifugal chiller always runs at the same speed, the motor may, at times, run faster than is actually necessary to provide cooling. This in turn causes the efficiency of the compressor to be reduced. Thus, fixed speed centrifugal chillers do not always operate at optimum efficiency. By varying the speed of the compressor in a centrifugal chiller, the efficiency of the centrifugal chiller is substantially increased in comparison to fixed speed operation.

The speed of an induction motor may be varied by changing the frequency of the alternating voltage applied to the motor. Commercial utilities only provide voltage at a fixed frequency, usually 60 hertz. Typically, to vary the speed of induction motors, the 60 hertz AC voltage provided by the utility company is converted to a fixed polarity (DC) voltage. Solid state power switching devices then convert the DC voltage to an AC voltage and apply the AC voltage to the motor. If the switching rate of the switches is varied, the frequency and the magnitude of the AC voltage may be varied, and the speed of the motor will change.

Semiconductor switches provide reliable high speed means to control high currents and high voltages. However, semiconductor switches have limitations on current capacity and voltage withstand capability. Insulated gate bipolar transistors ("IGBT") are high voltage semiconductor switches. IGBTs are, thus, useful in applications requiring fast, high voltage switching.

IGBTs typically include a collector, an emitter, and a gate. An IGBT switches current between the collector and emitter in response to a voltage applied to the gate. Specialized driver circuits apply a driving voltage to the gate of the IGBT. Such circuits typically convert a low voltage, small signal input pulse to a high voltage, low impedance output pulse for driving the gate of the IGBT. To insure fast switching, the driver circuit must accurately deliver the current required by the gate of the IGBT.

IGBTs used as high voltage, high current switches occasionally breakdown which could result in a short circuit across the battery or power supply if another IGBT is gated on. In addition, an inadvertent short circuit might mistakenly be applied across the output terminals of the variable speed drive. Such short circuits will produce a large current which can quickly destroy the semiconductor power switches and other circuit elements if means are not provided to remove the path of current flow.

To protect the power source and associated circuitry, it is desirable to quickly detect a short circuit condition in an IGBT and reduce the voltage applied to the gate of the IGBT to turn off the IGBT. Thus, under short circuit conditions, the gate voltage may be controlled, for example, by the exponential discharge of a capacitor through a resistor. This rate of change is very steep as the IGBT transitions through its active region, and the rapidly changing gate voltage causes the IGBT's collector current to change in a correspondingly rapid manner. Due to stray inductances in the power circuit, a high collector to emitter transient voltage may result.

The inventors of the present invention, however, have recognized that if the rate of change of voltage applied to the gate of the IGBT is reduced, the rate of change of current in the IGBT is also reduced, and the transient voltage developed, across the stray inductance is significantly reduced eliminating the possibility of device destruction due to an over voltage during short circuit conditions.

SUMMARY OF THE INVENTION

Accordingly, the present invention is directed to a driver circuit that substantially obviates one or more of the problems due to limitations and disadvantages of the related art.

The advantages and purpose of the invention will be set forth in part in the description which follows, and in part will be obvious from the description, or may be learned by practice of the invention. The advantages and purpose of the invention will be realized and attained by means of the elements and combinations particularly pointed out in the appended claims.

To attain the advantages and in accordance with the purpose of the invention, as embodied and broadly described herein, the invention comprises a switch driver circuit. The switch has a control terminal and a switchable current path. The driver circuit supplies a voltage to the control terminal. The driver circuit has means connected to the current path for detecting a short circuit condition and means, responsive to the means for detecting a short circuit condition, for linearly ramping down the voltage on the control terminal when a short circuit is detected.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principles of the invention. In the drawings.

DESCRIPTION OF THE PREFERRED EMBODIMENT

An insulated gate bipolar transistor ("IGBT") driver circuit supplies a high voltage pulse to the gate of an IGBT with respect to the emitter. The driver circuit also monitors the voltage at the collector of the IGBT with respect to the emitter. If the voltage at the collector of the IGBT does not drop to a given level within a given time period after the IGBT is gated on, the IGBT driver circuit determines that a short circuit has occurred and triggers a linear integrator within the driver circuit. The linear integrator gently ramps down the voltage on the gate of the IGBT. The ramp down of the gate voltage prevents a large collector to emitter current change within the IGBT. A large current change within the stray power circuit inductance could create a large voltage spike which might destroy the IGBT.

Reference will now be made in detail to the present preferred embodiment of the invention, an example of which is illustrated in the accompanying drawings. Wherever possible, the same reference numbers will be used throughout the drawings to refer to the same or alike parts.

Figure 1:
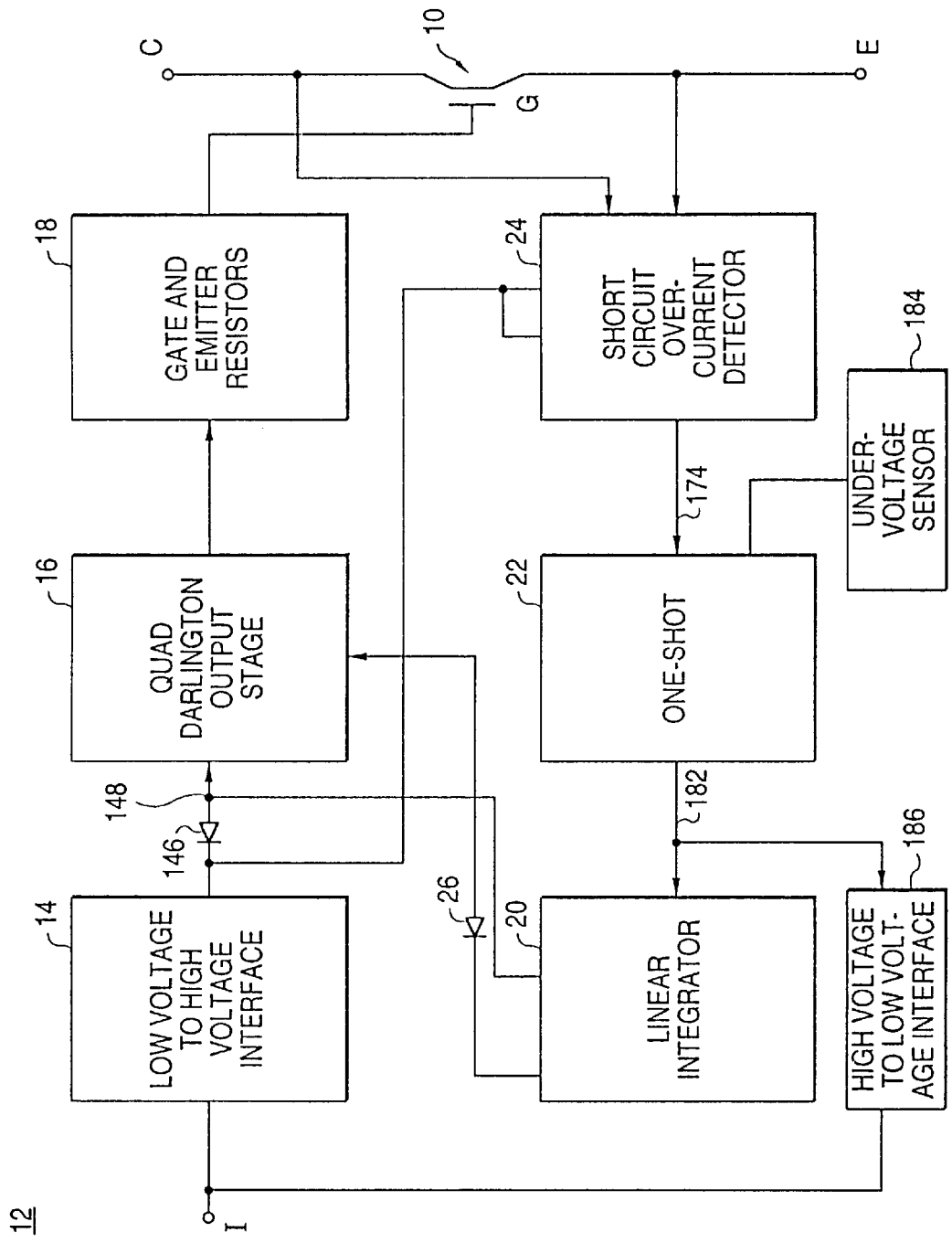
FIG. 1 shows a block diagram of an IGBT and a driver circuit according to an embodiment of the present invention.

The exemplary embodiment of the driver circuit of the present invention is shown in FIG. 1 and is designated generally by reference numeral 12. The driver circuit 12 drives an IGBT 10. The IGBT 10 includes an emitter E, a collector C, and a gate G.

A low voltage to high voltage interface 14 receives an input pulse at input node or terminal I and converts the low voltage input pulse to a high voltage. The high voltage output of the low voltage to high voltage interface 14 is fed through a quad Darlington output stage 16 to gate and emitter resistors 18. One of the gate resistors 18 connects the quad Darlingtcn output stage 16 to the gate G of the IGBT 10.

The quad Darlington output stage 16 steps up the current and voltage levels received from the low voltage to high voltage interface 14. The input of the quad Darlington output stage 16 is measured in milliamps, while the output is measured in amps. Thus, the quad Darlington output stage delivers a high current output pulse through the gate resistors 18 to the gate G of the IGBT.

While only one IGBT 10 is shown in FIG. 1, the driver circuit 12 may drive more than one IGBT 10 and preferably drives four IGBTs 10. The four IGBTs 10 may be connected in parallel to increase the switching capacity. Thus, gate resistor circuit 18 preferably includes four 10 ohm resistors and four 1 ohm resistors.

A short circuit overcurrent detector 24 monitors the voltage at the collector C of the IGBT 10 to determine whether a short circuit has occurred. If the IGBT 10 is turning on and off during normal operation, the collector voltage will drop when the switch is turned on. The short circuit overcurrent detector 24 is also connected to the low voltage to high voltage interface 14 so that the short circuit overcurrent detector 24 senses when the IGBT 10 is commanded to be turned on and off.

If the collector voltage does not drop below a given threshold within a given time period when the IGBT 10 is turned on or if the collector voltage rises above a given threshold after the IGBT 10 has been commanded to be on, the short circuit overcurrent detector 24 detects a short circuit. When a short circuit is detected, the short circuit overcurrent detector 24 sends an output signal to a one-shot 22. The one-shot 22 then generates a pulse which releases a clamp on linear integrator 20.

The linear integrator 20 is connected through a diode 26 to the input of the quad Darlington output stage 16. When a short circuit is detected, the linear integrator 20 receives a pulse from the one-shot 22. Upon receipt of that pulse, the linear integrator 20 will start a ramp down. The input of the quad Darlington output stage 16 will ramp down following the output voltage of the linear integrator via diode 26 at one diode drop (0.6 volts) above the voltage level of the linear integrator 20.

Figure 2:
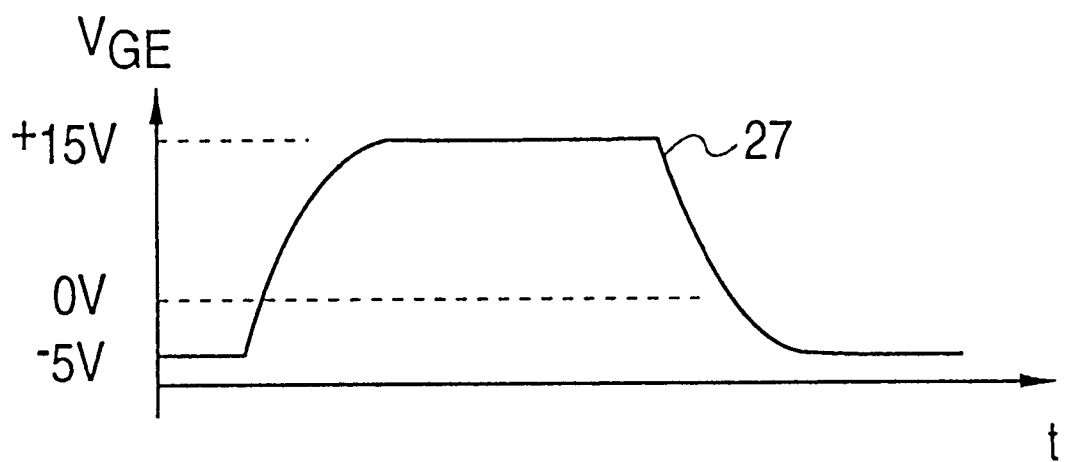
FIG. 2 shows a diagram of the time varying voltage output of the driver circuit shown in FIG. 1 under normal operating conditions.
Figure 3:
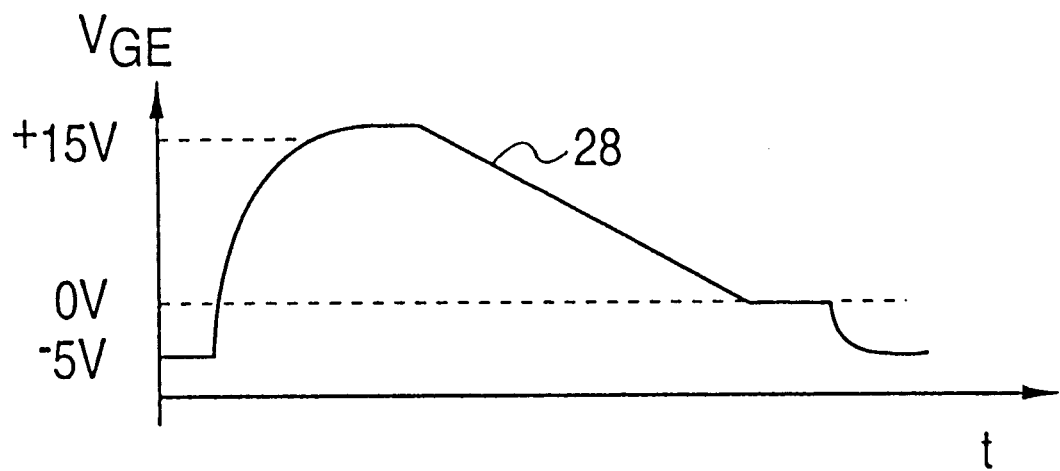
FIG. 3 shows a diagram of the time varying voltage output of the driver circuit shown in FIG. 1 under short circuit operating conditions.

FIGS. 2 and 3 show the output voltage pulse between terminals G and E as a function of time. FIG. 2 shows a timing diagram of the normal operation of the IGBT driver circuit 12. The normal output wave form 27 is a 15 volt substantially rectangular pulse.

FIG. 3 shows the output voltage pulse between terminals G and E as a function of time as driver circuit 12 gates an IGBT on into a short circuit. The linear ramp down of the gate voltage 28 by the linear integrator 20 is apparent in FIG. 3.

With the driver circuit 12, a short circuit across the device's output terminals is quickly detected, and the input voltage to the IGBT gate is ramped down, not suddenly cut off. The rate of change of G to E voltage is constant throughout the IGBT's linear region resulting in a reduction of the transient collector to emitter voltage at turnoff. Thus, voltage spikes due to rapid current changes within the stray circuit inductances are prevented.

As an alternative to the linear rampdown shown in FIG. 3, the driver circuit may incorporate an initial step change reduction followed by a linear rampdown of the gate voltage upon short circuit detection. The step change reduction quickly lowers the initial value of current conducted by the IGBT under short circuit conditions. The voltage step magnitude, however, is low enough to avoid the creation of a large voltage spike prior to the linear ramp down.

Figure 4:
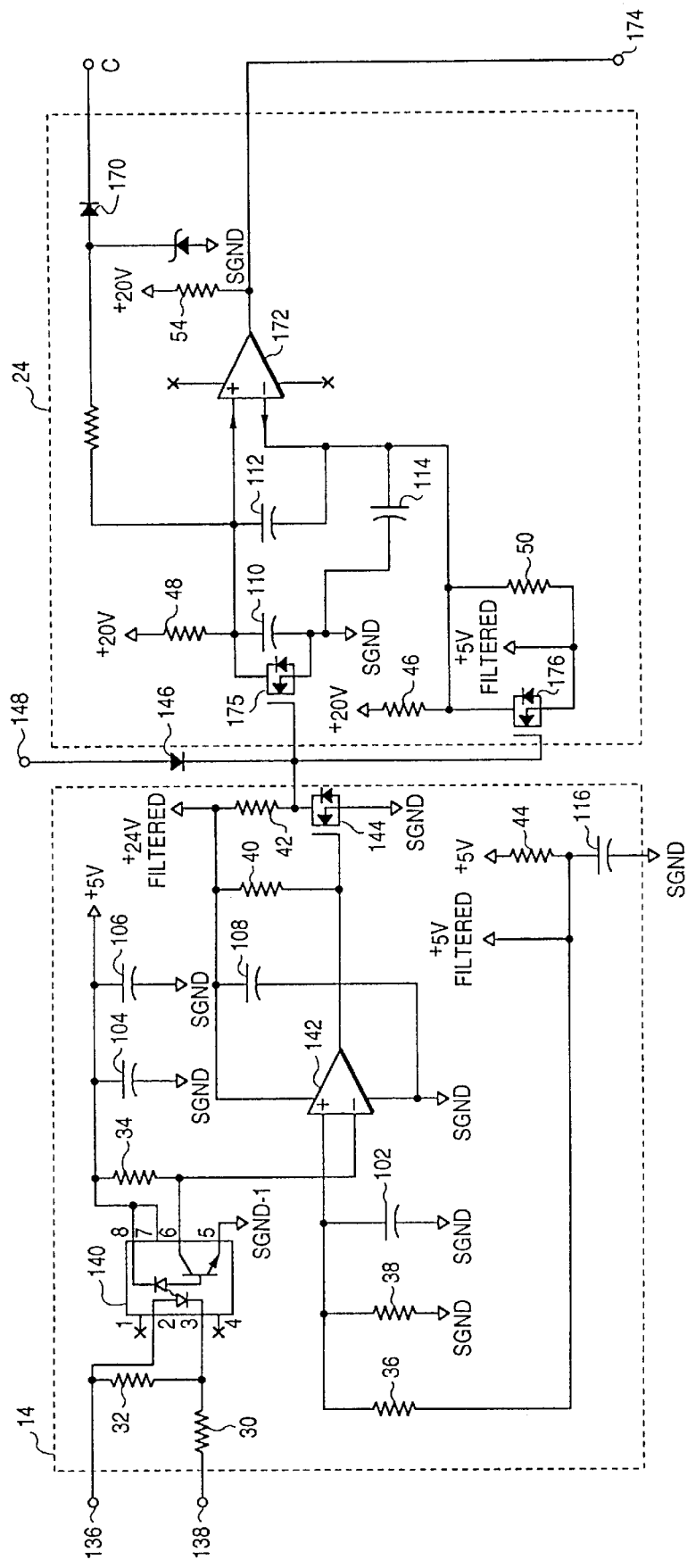
FIG. 4 shows a schematic circuit diagram of an embodiment of a low voltage to high voltage interface and a short circuit overcurrent detector which may be used in the driver circuit shown in FIG. 1.
Figure 5:
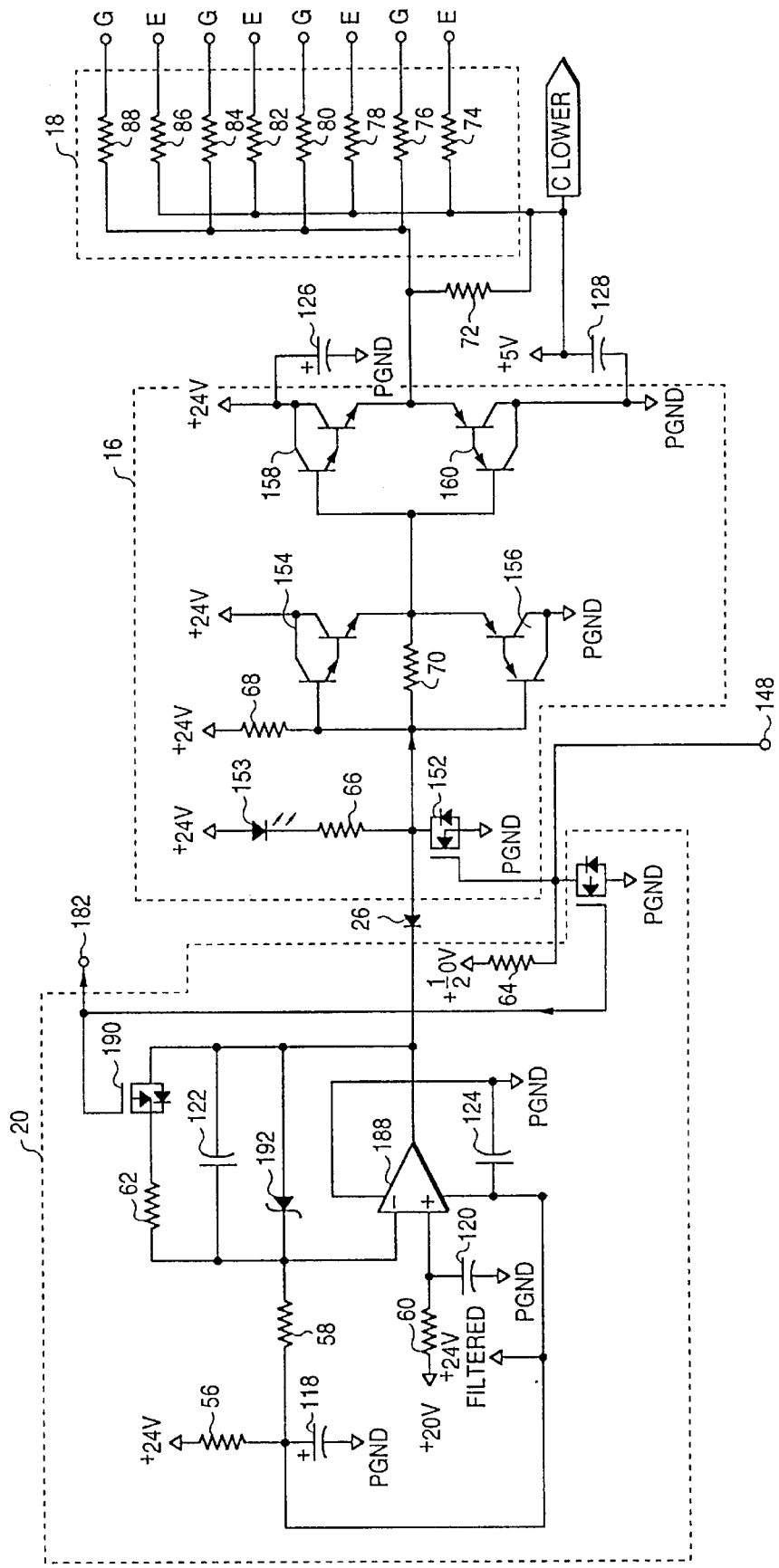
FIG. 5 shows a schematic circuit diagram of an embodiment of a linear integrator, a quad Darlington output stage, and gate resistors which may be used in the driver circuit shown in FIG. 1.
Figure 6:
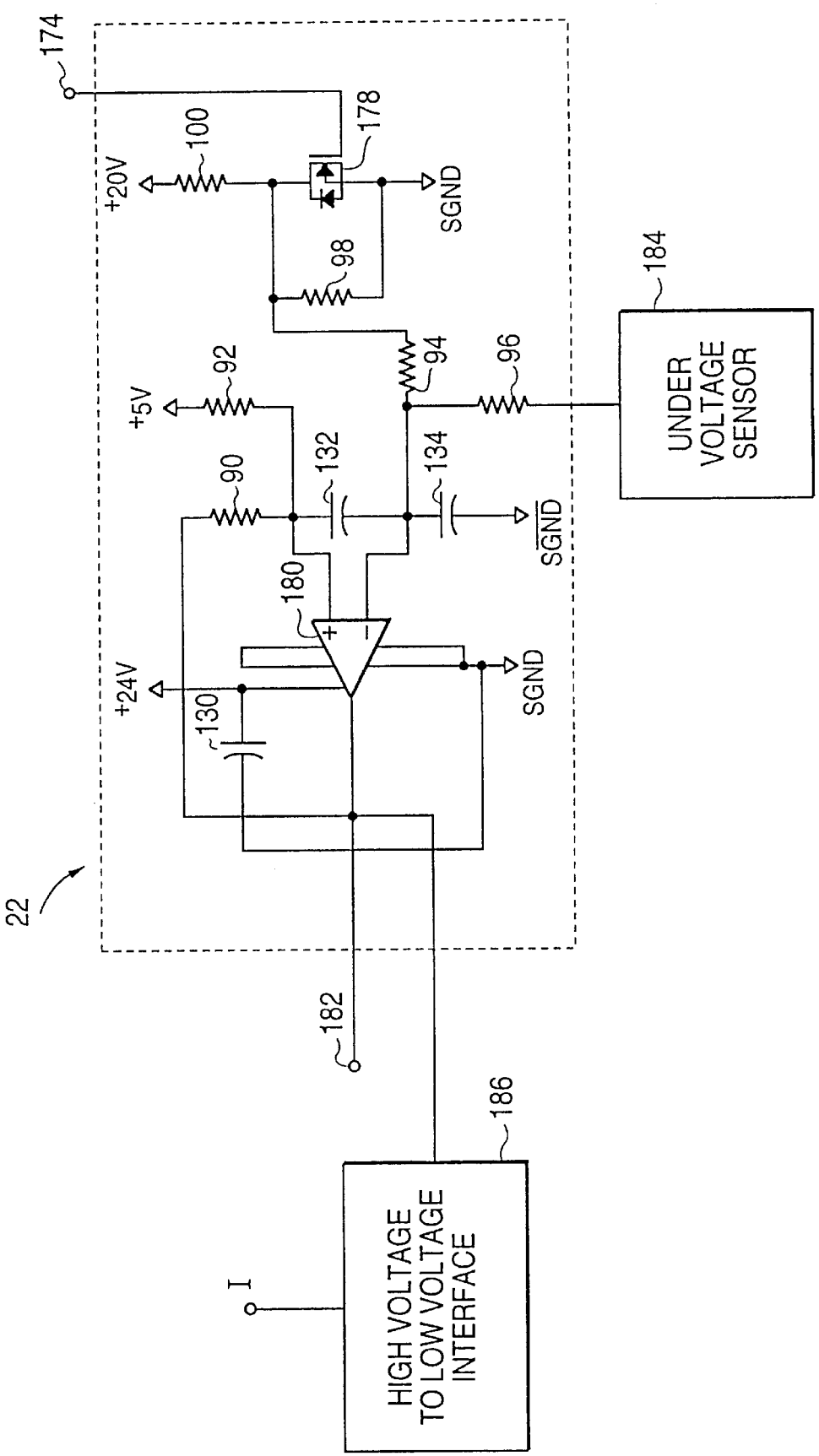
FIG. 6 shows a schematic circuit diagram of an embodiment of a one-shot which may be used in the IGBT gate driver circuit shown in FIG. 1.

FIGS. 4, 5, and 6 show detailed schematic drawings of one embodiment of the driver circuit 12 shown in FIG. 1. The resistors in FIGS. 4, 5, and 6 are designated by even reference numbers 30–100. In one embodiment of the invention, the resistors may have resistance values as shown in the following Table 1.

TABLE 1

| Ref. No. | Resistance in Ohms | Power in Watts |
|---|---|---|
| 30 | 360 | 0.25 |
| 32 | 2.4 k | 0.25 |
| 34 | 2.4 k | 0.25 |
| 36 | 220 | 0.25 |
| 38 | 91 | 0.25 |
| 40 | 6.8 k | 0.25 |
| 42 | 3 k | 0.25 |
| 44 | 10 | 0.25 |
| 46 | 1.21 k | 0.25 |
| 48 | 1 k | 0.50 |
| 50 | 1.91 k | 0.25 |
| 52 | 10 | 0.25 |
| 54 | 5.1 k | 0.25 |
| 56 | 10 | 0.25 |
| 58 | 1.33 k | 0.25 |

TABLE 1-continued

| Ref. No. | Resistance in Ohms | Power in Watts |
| --- | --- | --- |
| 60 | 10 k | 0.25 |
| 62 | 51 | 0.25 |
| 64 | 3 k | 0.25 |
| 66 | 4.3 k | 0.25 |
| 68 | 3 k | 0.25 |
| 70 | 1 k | 0.25 |
| 72 | 10 k | 0.25 |
| 74 | 1.0 | 0.25 |
| 76 | 10 | 0.25 |
| 78 | 1.0 | 0.25 |
| 80 | 10 | 0.25 |
| 82 | 1.0 | 0.25 |
| 84 | 10k | 0.25 |
| 86 | 1.0 | 0.25 |
| 88 | 10k | 0.25 |
| 90 | 510 k | 0.25 |
| 92 | 100 | 0.25 |
| 94 | 5.1 | 0.25 |
| 96 | 200 | 0.25 |
| 98 | 100 k | 0.25 |
| 100 | 100 k | 0.25 |

The capacitors in FIGS. 4, 5 and 6 are designated by even reference numbers 102–134. In one embodiment, the capacitors may have capacitance values as shown in the following Table 2.

TABLE 2

| Ref. No. | Capacitance | Voltage Rating |
| --- | --- | --- |
| 102 | 0.1 | 50V |
| 104 | 22 | 35 |
| 106 | 0.1 | 50 |
| 108 | 0.1 | 50 |
| 110 | 2200 pF | 50 |
| 112 | 1800 pF | 50 |
| 114 | 2200 pF | 50 |
| 116 | 22 | 35 |
| 118 | 22 | 35 |
| 120 | 0.1 | 50 |
| 122 | 1500 pF | 50 |
| 124 | 0.1 | 50 |
| 126 | 470 | 35 |
| 128 | 1000 | 25 |
| 130 | 0.1 | 50 |
| 132 | 1500 pF | 50 |
| 134 | 0.22 | 50 |

The ground voltages SGND and PGND are separate ground references (signal ground and power ground) that are ultimately tied together at the gate driver power supply.

As shown in FIG. 4, the low voltage to high voltage interface 14 includes input terminals 136 and 138 which correspond to the terminal I shown in FIG. 1, an optical coupler 140, a voltage comparator 142, and a driving signal transistor 144 connected together. A commercially available voltage comparator may be used for voltage comparator 142 such as, for example, model No. LM393 from National Semiconductor Corp. Input terminals 136 and 138 receive an input voltage which is fed through resistors 30 and 32 and across the optical coupler 140. The on/off pulse is then fed through the voltage comparator 142 to the driving signal transistor 144.

The optical coupler 140 serves two purposes. The optical coupler 140 provides voltage isolation between terminals 2/3 and 8/7/6/5 and couples an on/off gating signal to comparator 142.

When transistor 144 is turned off, the output of the driving signal transistor 144 reverse biases diode 146 and terminal 148 is pulled to +20 volts via resistor 64 provided the linear integrator 20 is not activated. Terminal 148 shown in FIG. 4 connects with terminal 148 shown in FIG. 5. The output of the driving signal transistor 144 appears on the gate of field effect transistor 152 shown in FIG. 5. A positive voltage pulse on terminal 148 turns on transistor 152 allowing a current to flow through a light emitting diode 153 and resistor 66. The pnp transistors within the quad Darlington output stage 16 are activated when transistor 152 turns on causing the G to E terminal voltage to transition to a −5 volt level.

As shown in FIG. 5, the quad Darlington output stage 16 includes four bipolar Darlington transistors designated by even numbers 154 through 160. The Darlington npn transistor 154 creates a push-pull follower with Darlington pnp bipolar transistor 156. In a like manner, Darlington connected npn bipolar transistor 158 creates a push-pull follower with Darlington pnp bipolar transistor 160. The quad Darlington output stage 16 steps up the current which is applied to gate resistors 18. In alternative embodiments, the quad Darlington output stage 16 might be replaced with a single npn/pnp emitter follower pair, a single npn Darlington/pnp Darlington pair, or some other circuit, depending on the current driving capability desired.

Gate resistors 76, 80, 84, and 88 connect the quad Darlington output stage 16 to the gates of four parallel IGBTs. Resistors 74, 78, 82, and 86 shown in FIG. 5 connect to the emitters of the four parallel IGBTs.

As shown in FIG. 4, the short circuit over current detector 24 includes field effect transistors 175 and 176 and a voltage comparator 172. A commercially available voltage comparator may be used for voltage comparator 172 such as, for example, model No. LM393 from National Semiconductor Corp. The drain of transistor 175 is connected to the non-inverting terminal of voltage comparator 172, while the drain of transistor 176 is connected to the inverting terminal of voltage comparator 172. The output of the voltage comparator 172 is connected to terminal 174. Resistor 48 connects a 20 volt potential to the source of transistor 175, while resistor 46 connects a 20 volt potential to the source of transistor 176. The gates of transistors 175 and 176 are connected to the driving signal transistor 144.

The short circuit over current detector 24 is connected to the collector C of IGBT 10. The short circuit over current detector monitors the voltage of the collector C of the IGBT 10 to determine whether a short circuit has occurred. When the voltage of terminal C drops, diode 170 will pull the non-inverting terminal of the operational amplifier 172 down with it, and the voltage at the non-inverting terminal will drop below the voltage at the inverting terminal of voltage comparator amplifier 172. If the voltage at the non-inverting terminal does not drop, the voltage comparator 172, changes state and sends an output to terminal 174.

Transistors 175 and 176 act as on and off switches for the short circuit overcurrent detector 24. The output of driving signal transistor 144 turns on transistors 175 and 176 when the IGBT is gated off which disables the short circuit sensing function of voltage comparator 172. Capacitors 110, 112, and 114 determine the time delay between gating on the IGBT and enabling the overcurrent detector. Resistors 40 and 50 form a voltage divider which determines the threshold level that the collector terminal must drop below to avoid setting off the overcurrent detector.

Terminal 174 shown in FIG. 4 is connected to terminal 174 shown in FIG. 6.

As shown in FIG. 6, the one-shot 22 receives the output of voltage comparator 172 at terminal 174. Terminal 174 is connected to the gate of field effect transistor 178, and the drain of field effect transistor 178 is connected to the inverting terminal of a voltage comparator 180. A commercially available voltage comparator may be used for voltage comparator 180 such as, for example, model No. LM311 from National Semiconductor Corp. If a short circuit is detected, the one-shot 122 outputs a pulse on terminal 182. Terminal 182 shown in FIG. 6 is connected to terminal 182 of linear integrator 20 shown in FIG. 5.

The one-shot 22 shown in FIG. 6 is also connected to an under voltage sensor 184 and a high voltage to low voltage interface 186. The high voltage to low voltage interface 186 receives the output of the one-shot and alerts the input of the circuit of the short circuit condition. The under voltage sensor 184 monitors the power supply of the IGBT driver circuit.

As shown in FIG. 5, the linear integrator 20 includes an operational amplifier 188 and a feedback circuit. A commercially available operational amplifier may be used for operational amplifier 188 such as for example model No. TL081 from Texas Instruments Corp. The feedback circuit includes resistor 62, capacitor 122, and a zener diode 192 connected in parallel. An input terminal 182 of the linear integrator 20 is connected to the gate of field effect transistor 190 in the feedback circuit.

Field effect transistor 190 is normally turned on causing resistor 62 to parallel capacitor 122, but a pulse on terminal 182 from one-shot 22 in response to a short circuit will turn off the field effect transistor 190. When field effect transistor 190 turns off, the output of operational amplifier 188 will start a linear ramp down with the rate set by resistor 58 and capacitor 122. The input of the quad Darlington output stage 16 at resistor 70 will ramp down through diode 26 at one diode drop (0.6 volts) above the output voltage of the operational amplifier 188.

Thus, the gate voltage of the IGBT is controlled by the linear rampdown of the linear integrator 20. The rate of discharge of the gate voltage is constant through the IGBT's linear region, and transient voltages across the IGBT due to stray inductance and high rates of change of current are avoided.

The linear rate of change of the discharge of the gate voltage is adjustable by adjusting the specific capacitances and resistances used in the linear integrator 20. The factors considered in setting the linear rate of change include: the characteristics of the IGBT, the parasitic conductances and inductances of the power circuit within which the IGBT is placed, and the level of voltage overshoot under short circuit conditions which is deemed acceptable.

In the preferred embodiment of the present invention, the rate of change is 2 volts per microsecond. The resistor 58 and the capacitor 122 in the linear integrator 20 determine the rampdown rate. The voltage across resistor 58 determines the current through resistor 58 which in turn flows through the capacitor 122 when the transistor 190 turns off. The rate of change is calculated as follows:

i=C(dv/dt) yields:

dv/dt=i/c, wherein:

i=current

C=capacitance dv/dt=change in voltage as a function of time.

In this embodiment:

i=–(24 V–20 V)/1.33 k=3 milliamps and dv/dt=–3 ma/1500 pF=–2 V/$\mu$sec.

The driver circuit may drive four IGBTs rated for 1200 volts and 200 amps. Such IGBTs are rated to withstand a 10 microsecond "ON" time when placed directly across a 1200 V voltage source if the parasitic inductance of the power circuitry is less than 50 nH. The level of current each IGBT can conduct with a gate voltage of +15 volts is specified as typically ten times the rated value. These values indicate that the withstand energy of each 200 AMP IGBT is:

(1200 V)(200 A)(10)(10 usec)=24 Joules.

Thus, the driver circuit 12 should detect a short circuit condition and bring the gate voltage below the conduction threshold level of the IGBT in a sufficiently short time to limit the energy to less than 24 Joules. The duration of the conduction interval is preferably less than 10 microseconds. This time can be extended if the energy is reduced below 24 Joules. This trade-off between short circuit energy and rampdown time duration is a function of the power device's peak junction temperature during a short circuit condition.

The preferred embodiment of the present driver circuit typically takes 3.8 microseconds to detect a short circuit condition. Assuming a maximum detection time of 4.6 microseconds and a withstand time of 10 microseconds, the linear rampdown time is preferably 5.4 microseconds. The positive gate drive level for normal device turn on is typically +15 volts and a typical conduction threshold on the IGBT gate is 10 volts. This yields an allowable rampdown rate during a short circuit condition of:

(15 V–10 V)/5.4 $\mu$sec=–0.926 V/$\mu$sec.

Thus, the actual rampdown rate of –2 V/$\mu$sec is faster than the acceptable rate of –0.926 V/$\mu$sec.

Applications for the driver circuit include inverters for induction motors such as motors in centrifugal chillers. As mentioned above, the driver circuit 12 preferably drives four IGBTs. The four IGBTs may be connected in parallel to handle four times as much voltage and power as a single IGBT. Driver circuits are also preferably arranged in pairs of upper gate driver circuits and lower gate driver circuits. Thus, each pair of driver circuits drives a total of eight IGBTs, and each eight IGBTs are connected to one pole of an AC motor. To drive a 3-phase AC motor with this configuration requires twenty-four IGBTs.

Figure 7:
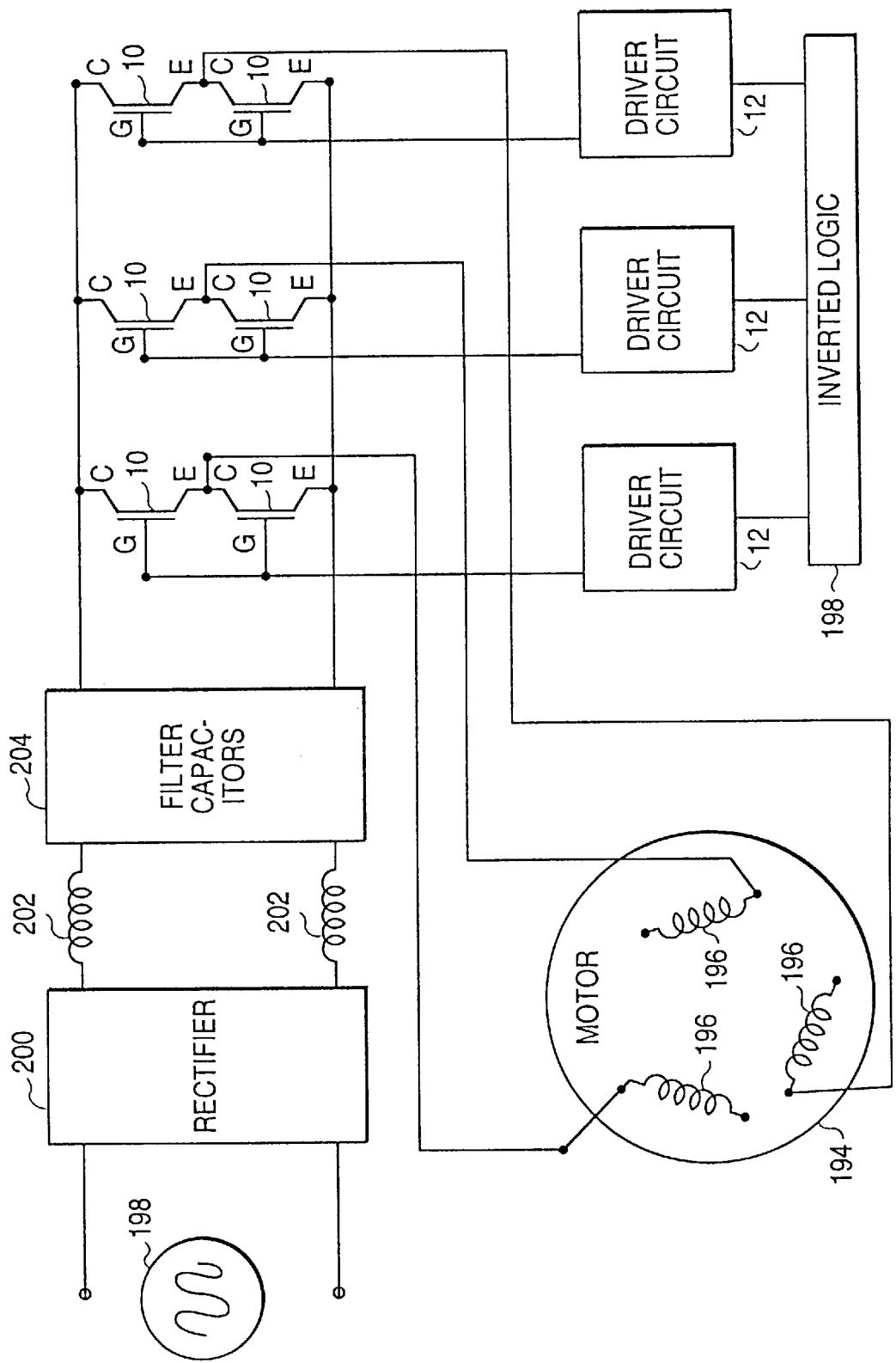
FIG. 7 shows a schematic diagram of a driver circuit, six IGBTs, and a motor.

Referring to FIG. 7, a plurality of insulated gate bipolar transistors 10 may drive an alternating current induction motor 194. In FIG. 7, each IGBT 10 may actually comprise a number of IGBTs, for example, four, connected in parallel. The IGBTs 10 are connected in pairs between input DC voltage lines. A gate driver circuit 12 is connected to the gates of each pair of IGBTS. The driver circuits 12 can switch the IGBTs at different speeds to run the motor 194 at different speeds. The variable speed induction motor 194 may drive the impeller on a centrifugal chiller unit.

An alternating current drive source 198 supplies an AC voltage to a diode rectifier or silicon controlled rectifier (SCR) 200. The rectifier 200 converts the input AC voltage to a DC voltage. The DC voltage is output through a pair of inductors 202 and capacitors 204. The capacitors and inductors filter the rectified AC voltage to a smooth D.C. level.

The driver circuits 12 convert the low level signals generated by inverter logic 198 to a level which can gate the IGBT power switches 10 on and off. By gating the IGBT power switches 10 on and off in an adequate manner, the DC voltage supplied by the rectifier 200, inductors 202, and filter capacitors 204 is converted back into an AC voltage which is variable in both frequency and magnitude. This variable output voltage/frequency source in turn drives the motor 194 at a frequency and voltage suitable to turn the compressor at a given speed.

It will be apparent to those skilled in the art that various modifications and variations can be made in the driver circuit of the present invention and in construction of this driver circuit without departing from the scope or spirit of the invention.

For the example, in accordance with one aspect of the invention, a known driver circuit such as, for example, the Fuji EXB841 can be modified to provide a linear short circuit rampdown instead of an exponential R-C discharge. Additionally, while the invention has been described in terms of an IGBT driver circuit, a driver circuit with a linear ramp down upon short circuit detection could be used for other voltage controlled power switches such as MOSFET's or MCT's. Most switches have a switchable current path between first and second terminals and a control terminal. The control terminal of a transistor, for example, may be a gate or a base.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A switch driver circuit for driving a switch having a control terminal and a switchable current path, the driver circuit comprising:
   means, connected to the control terminal, for supplying a voltage to the control terminal;
   means, connected to the switchable current path for detecting a short circuit condition; and
   means, responsive only to a detected short circuit condition, for linearly ramping down the voltage on the control terminal and for preventing a large voltage spike across the switchable current path.

2. The driver circuit as claimed in claim 1, wherein the means for ramping down comprises a linear integrator.

3. The driver circuit as claimed in claim 2, wherein the means for detecting a short circuit comprises voltage comparator.

4. The driver circuit as claimed in claim 3, wherein the switch comprises an insulated gate bipolar transistor having a gate and the control terminal comprises the gate of the insulated gate bipolar transistor.

5. The driver circuit as claimed in claim 4, wherein the means for supplying a voltage comprises:
   a low voltage to high voltage converter connected to an input node;
   a quad Darlington output stage connected to the low voltage to high voltage converter; and
   at least one resistor connected between the quad Darlington output stage and the control terminal.

6. The driver circuit as claimed in claim 1, wherein the switch comprises an insulated gate bipolar transistor having a gate and the control terminal comprises the gate of the insulated gate bipolar transistor.

7. An insulated gate bipolar transistor driver circuit for driving an insulated gate bipolar transistor having a gate, a collector, and an emitter, the driver circuit comprising:
   means, connected to the gate, for supplying a voltage to the gate;
   means, connected to the collector, for detecting a short circuit condition; and
   means, responsive to the means for detecting a short circuit condition, for linearly ramping down the voltage on the gate only when a short circuit is detected and for preventing a large voltage spike across the collector and emitter.

8. The driver circuit as claimed in claim 7, wherein the means for ramping down comprises a linear integrator.

9. The driver circuit as claimed in claim 8, wherein the means for detecting a short circuit comprises a voltage comparator.

10. The driver circuit as claimed in claim 9, wherein the means for supplying a voltage comprises:
    a low voltage to high voltage converter connected to an input node;
    a quad Darlington output stage connected to the low voltage to high voltage converter; and
    a gate resistor connected between the quad Darlington output stage and the gate.

11. A variable speed driver circuit for a motor, comprising:
    at least two insulated gate bipolar transistors, each having a gate, a collector, and an emitter, one of the collectors and one of the emitters being connected to stator windings of the motor; and
    an insulated gate bipolar transistor driver circuit, the driver circuit supplying a voltage to the gates, the driver circuit comprising:
      means, connected to at least one of the gates, for supplying a voltage,
      means, connected to at least one of the collectors, for detecting a short circuit condition, and
      means, responsive to the means for detecting a short circuit condition, for linearly ramping down the voltage on the at least one of the gates only when a short circuit is detected and for preventing a large voltage spike across one of the collectors and one of the emitters connected to the stator windings.

12. The drive circuit as claimed in claim 11, wherein the means for detecting a short circuit comprises a voltage comparator.

13. The drive circuit as claimed in claim 12, wherein the means for ramping down comprises a linear integrator.

14. The drive circuit as claimed in claim 13, wherein the means for supplying a voltage comprises:
    a low voltage to high voltage converter connected to an input node;
    a quad Darlington output stage connected to the low voltage to high voltage converter; and
    a gate resistor connected between the quad Darlington output stage and the at least one of the gates.

15. A method for driving an insulated gate bipolar transistor, the insulated gate bipolar transistor having a gate, a collector, and an emitter, the method comprising the steps of:
    supplying a voltage to the gate;
    detecting the voltage at the collector;
    detecting a short circuit condition if the voltage at the collector does not drop over a predetermined period of time; and
    linearly ramping down the voltage on the gate only when a short circuit is detected, thereby preventing a large voltage spike across the collector and emitter.

* * * * *

UNITED STATES PATENT AND TRADEMARK OFFICE
CERTIFICATE OF CORRECTION

PATENT NO. : 5,898,554
DATED : April 27, 1999
INVENTOR(S) : Harold R. SCHNETZKA et al.

It is certified that error appears in the above-identified patent and that said Letters Patent is hereby corrected as shown below:

In the Title page, item [57], sixth line of Abstract, "IQBT" should read --IGBT--.

Signed and Sealed this

Fourteenth Day of December, 1999

Attest:

Attesting Officer

Q. TODD DICKINSON

Acting Commissioner of Patents and Trademarks